US009548321B2

(12) United States Patent
Lee et al.

(10) Patent No.: US 9,548,321 B2
(45) Date of Patent: Jan. 17, 2017

(54) METHOD OF MANUFACTURING THIN FILM TRANSISTOR (TFT) ARRAY SUBSTRATE

(71) Applicant: SAMSUNG DISPLAY CO., LTD., Yongin, Gyeonggi-Do (KR)

(72) Inventors: June-Woo Lee, Yongin (KR); Jae-Beom Choi, Yongin (KR); Kwan-Wook Jung, Yongin (KR); Jae-Hwan Oh, Yongin (KR); Seong-Hyun Jin, Yongin (KR); Kwang-Hae Kim, Yongin (KR); Jong-Hyun Choi, Yongin (KR)

(73) Assignee: SAMSUNG DISPLAY CO., LTD, Yongin, Gyeonggi-do (KR)

( * ) Notice: Subject to any disclaimer, the term of this patent is extended or adjusted under 35 U.S.C. 154(b) by 0 days.

(21) Appl. No.: 14/677,081

(22) Filed: Apr. 2, 2015

(65) Prior Publication Data

US 2015/0214252 A1 Jul. 30, 2015

Related U.S. Application Data

(62) Division of application No. 13/323,108, filed on Dec. 12, 2011, now Pat. No. 9,000,444.

(30) Foreign Application Priority Data

Jul. 14, 2011 (KR) .................. 10-2011-0070027

(51) Int. Cl.
*H01L 21/00* (2006.01)
*H01L 21/84* (2006.01)
(Continued)

(52) U.S. Cl.
CPC ......... *H01L 27/1237* (2013.01); *H01L 27/127* (2013.01); *H01L 27/1255* (2013.01);
(Continued)

(58) Field of Classification Search
CPC .......... H01L 27/1237; H01L 29/66742; H01L 27/1255; H01L 27/1288
(Continued)

(56) References Cited

U.S. PATENT DOCUMENTS

| 2001/0017371 A1 | 8/2001 | Tanaka et al. |
| 2002/0021266 A1 | 2/2002 | Koyama et al. |

(Continued)

FOREIGN PATENT DOCUMENTS

| CN | 1476282 A | 2/2004 |
| EP | 1 760 789 A2 | 3/2007 |

(Continued)

OTHER PUBLICATIONS

European Search Report dated Jun. 4, 2013.

*Primary Examiner* — Robert Huber
(74) *Attorney, Agent, or Firm* — Lee & Morse P.C.

(57) ABSTRACT

A thin film transistor (TFT) array substrate is provided that includes a TFT on a substrate. The TFT can include an active layer, gate electrode, source electrode, drain electrode, first insulating layer between the active layer and the gate electrode, and second insulating layer between the gate electrode and the source and drain electrodes. A pixel electrode is disposed on the first and second insulating layers. A capacitor including a lower electrode is disposed on a same layer as the gate electrode and an upper electrode. A third insulating layer directly between the second insulating layer and the pixel electrode and between the lower electrode and the upper electrode. A fourth insulating layer covers the source electrode, the drain electrode, and the upper electrode, and exposes the pixel electrode and can further expose a pad electrode.

9 Claims, 8 Drawing Sheets

(51) Int. Cl.
  *H01L 27/12*   (2006.01)
  *H01L 27/32*   (2006.01)
  *H01L 51/52*   (2006.01)
  *H01L 29/66*   (2006.01)

(52) U.S. Cl.
  CPC ...... *H01L 27/1288* (2013.01); *H01L 27/3265* (2013.01); *H01L 51/5215* (2013.01); *H01L 51/5265* (2013.01); *H01L 27/3276* (2013.01); *H01L 29/66742* (2013.01); *H01L 2227/323* (2013.01)

(58) Field of Classification Search
  USPC .................... 257/72, E21.411; 438/151, 155
  See application file for complete search history.

(56) References Cited

U.S. PATENT DOCUMENTS

| | | |
|---|---|---|
| 2002/0104995 A1 | 8/2002 | Yamazaki et al. |
| 2003/0141811 A1 | 7/2003 | Park et al. |
| 2004/0004432 A1 | 1/2004 | Park et al. |
| 2005/0270454 A1 | 12/2005 | Ahn et al. |
| 2005/0285100 A1 | 12/2005 | Jeong et al. |
| 2008/0265254 A1 | 10/2008 | Nishiura |
| 2009/0278131 A1 | 11/2009 | Kwon et al. |
| 2010/0193790 A1 | 8/2010 | Yeo et al. |
| 2011/0266546 A1* | 11/2011 | You .................... H01L 27/1255 257/59 |
| 2012/0001182 A1* | 1/2012 | Choi .................... H01L 27/1255 257/59 |

FOREIGN PATENT DOCUMENTS

| | | |
|---|---|---|
| JP | 2001-242803 A | 9/2001 |
| JP | 2002-006777 A | 1/2002 |
| JP | 2003-337541 A | 11/2003 |
| JP | 2005-352479 A | 12/2005 |
| JP | 2006-012768 A | 1/2006 |
| JP | 2011-065837 A | 3/2011 |
| KR | 10-2000-0039802 A | 7/2000 |
| KR | 10-2005-0111171 A | 11/2005 |
| KR | 10-2009-0116131 | 11/2009 |
| KR | 10-2010-0088269 | 8/2010 |
| WO | WO 03/071511 A2 | 8/2003 |

* cited by examiner

METHOD OF MANUFACTURING THIN FILM TRANSISTOR (TFT) ARRAY SUBSTRATE

CROSS REFERENCE TO RELATED APPLICATION

This is a divisional application based on pending application Ser. No. 13/323,108, filed Dec. 12, 2011, the entire contents of which is hereby incorporated by reference.

BACKGROUND

1. Field

Embodiments disclosed herein relate to a thin film transistor (TFT) array substrate, an organic light-emitting display device including the same, and a method of manufacturing the organic light-emitting display device.

2. Description of the Related Art

Flat panel display devices such as organic light-emitting display devices and liquid crystal display (LCD) devices include a thin film transistor (TFT), a capacitor, and a wiring for connecting the TFT and the capacitor.

SUMMARY

According to an embodiment, there is provided a thin film transistor (TFT) array substrate, including a TFT disposed on a substrate, the TFT including an active layer, a gate electrode, a source electrode, a drain electrode, a first insulating layer disposed between the active layer and the gate electrode, and a second insulating layer disposed between the gate electrode and the source and drain electrodes, a pixel electrode disposed on the first insulating layer and the second insulating layer, the pixel electrode being connected to one of the source electrode and the drain electrode, a capacitor including a lower electrode disposed on a same layer as the gate electrode, and including an upper electrode including a same material as the pixel electrode, a third insulating layer directly disposed between the second insulating layer and the pixel electrode and between the lower electrode and the upper electrode, and a fourth insulating layer that covers the source electrode, the drain electrode, and the upper electrode, and exposes the pixel electrode.

The first insulating layer may be commonly disposed over the active layer and under the lower electrode.

The second insulating layer may not be disposed between the upper electrode and the lower electrode.

A thickness of the third insulating layer may be less than a thickness of the second insulating layer.

A thickness of the third insulating layer may be equal to or greater than about 500 Å and equal to or less than about 2000 Å.

A dielectric constant of the third insulating layer may be higher than a dielectric constant of the first insulating layer.

The third insulating layer may include at least one of $SiN_x$, $SiO_2$, $ZrO_2$, $TiO_2$, $Ta_2O_5$, and $Al_2O_3$.

The first insulating layer, the second insulating layer, and the third insulating layer may be sequentially disposed between the pixel electrode and the substrate. Refractive indices of adjacent insulating layers of the first through third insulating layers may be different from each other.

The pixel electrode may include a transparent conductive oxide (TCO).

The TCO may include at least one of indium tin oxide (ITO), indium zinc oxide (IZO), zinc oxide (ZnO), indium oxide ($In_2O_3$), indium gallium oxide (IGO), and aluminum zinc oxide (AZO).

The pixel electrode may further include a semi-transmissive metal layer.

The semi-transmissive metal layer may be disposed on a layer including the transparent conductive oxide.

The semi-transmissive metal layer may include at least one of silver (Ag), an Ag alloy, aluminum (Al), and an Al alloy.

The TFT array substrate may further include a protective layer disposed on the semi-transmissive metal layer.

The protective layer may include a TCO.

Lateral surfaces of the pixel electrode may align with lateral surfaces of the third insulating layer.

Lateral surfaces of the upper electrode may align with lateral surfaces of the third insulating layer.

A portion of one of the source electrode and the drain electrode that is connected to the pixel electrode may be disposed over the pixel electrode.

The source electrode and the drain electrode may include a material having an etching rate different from an etching rate of the pixel electrode and the upper electrode.

The TFT array substrate may further include a pad electrode formed of a same material as the source electrode and the drain electrode.

The pad electrode may be disposed on a same layer as the source electrode and the drain electrode.

According to an embodiment, there is provided an organic light-emitting display device, including a TFT disposed on a substrate, the TFT including an active layer, a gate electrode, a source electrode, a drain electrode, a first insulating layer disposed between the active layer and the gate electrode, and a second insulating layer disposed between the gate electrode and the source and drain electrodes, a pixel electrode disposed on the first insulating layer and the second insulating layer, is the pixel electrode being connected to one of the source electrode and the drain electrode, a capacitor including a lower electrode disposed on a same layer as the gate electrode, and including an upper electrode including a same material as a material of the pixel electrode, a third insulating layer directly disposed between the second insulating layer and the pixel electrode and between the lower electrode and the upper electrode, a fourth insulating layer that covers the source electrode, the drain electrode, and the capacitor, and exposes the pixel electrode, an organic light-emitting layer disposed on the pixel electrode, and a counter electrode disposed on the organic light-emitting layer.

The counter electrode may be a reflective electrode that reflects light emitted by the organic light-emitting layer.

According to an embodiment, there is provided a method of manufacturing a TFT array substrate, the method including forming a semiconductor layer on a substrate and forming an active layer of a TFT by patterning the semiconductor layer using a first mask process, forming a first insulating layer, stacking a first conductive layer on the first insulating layer, and forming a gate electrode of the TFT and a lower electrode of a capacitor by patterning the first conductive layer using a second mask process, forming a second insulating layer, and forming an opening in the second insulating layer using a third mask process to expose a source region and a drain region of the active layer and an upper electrode of the capacitor, sequentially forming a third insulating layer and a second conductive layer on a resultant structure of the third mask process, and forming a pixel electrode, the upper electrode, and a dielectric film that is directly disposed on the lower electrode by simultaneously or sequentially patterning the third insulating layer and the second conductive layer using a fourth mask process, forming a third conductive layer on a resultant structure of the fourth mask process, and forming a source electrode and a drain electrode by patterning the third conductive layer using a fifth mask process, and forming a fourth insulating layer and removing using portion of the fourth insulating layer to expose the pixel electrode using a sixth mask process.

The method may further include doping the source region and the drain region with ion impurities after forming the gate electrode using the second mask process.

The fourth mask process may include a first etching process to etch the third insulating layer, and a second etching process to etch the second conductive layer.

The third conductive layer may include a material having an etching rate different from an etching rate of a material of the second conductive layer.

The method may further include forming a pad electrode including the same material as the source electrode and the drain electrode using the fifth mask process.

The second conductive layer may be formed by sequentially stacking a transparent conductive layer and a semi-transmissive conductive layer.

The method may further include forming a protective layer on the semi-transmissive conductive layer.

The third insulating layer may be formed to have a thickness less than a thickness of the second insulating layer.

The third insulating layer may be formed of a material having a dielectric constant higher than a dielectric constant of the first insulating layer.

BRIEF DESCRIPTION OF THE DRAWINGS

The above and other features will become more apparent to those of ordinary skill in the art by describing in detail exemplary embodiments with reference to the attached drawings, in which.

DETAILED DESCRIPTION

Figure 1:
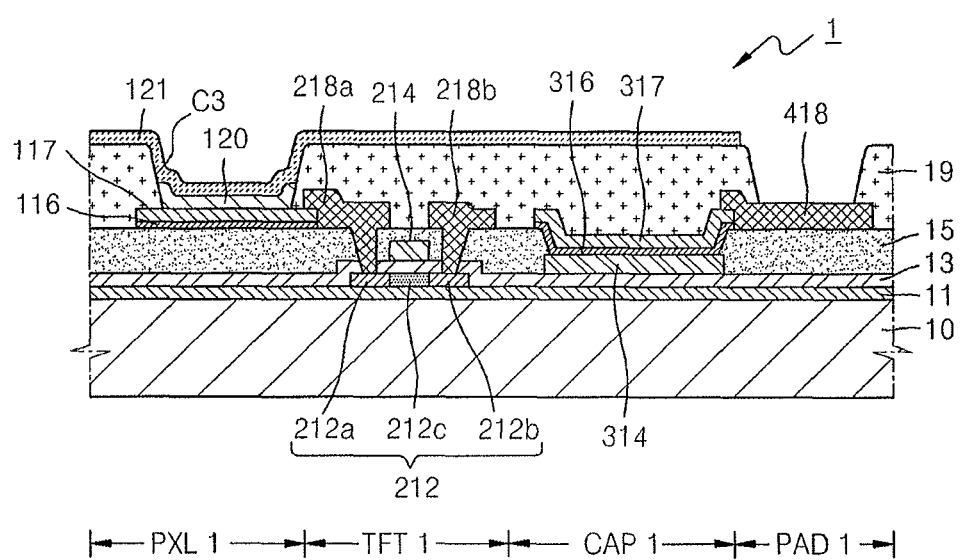
FIG. 1 illustrates a cross-sectional view depicting an organic light-emitting display device according to an embodiment.

Korean Patent Application No. 10-2011-0070027, filed on Jul. 14, 2011, in the Korean Intellectual Property Office, and entitled: "Thin Film Transistor Array Substrate, Organic Light-Emitting Display Device Including the Same, and Method of Manufacturing the Organic Light-Emitting Display Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a cross-sectional view depicting an organic light-emitting display device 1 according to an embodiment.

Referring to FIG. 1, a substrate 10 of the organic light-emitting display device 1 may include a pixel region PXL1 in which at least one organic light-emitting layer 120 may be disposed, a thin film transistor (TFT) region TFT1 in which at least one TFT may be disposed, a capacitor region CAP1 in which at least one capacitor may be disposed, and a pad region PAD1 in which a pad electrode 418 may be disposed.

An active layer 212 of the TFT may be disposed on the substrate 10 and a buffer layer 11 may be disposed in the transistor region TFT1.

The substrate 10 may be a transparent substrate such as a glass substrate or a plastic substrate including polyethylene terephthalate (PET), polyethylene naphthalate (PEN), polyimide, or the like.

In order to planarize the substrate 10 and prevent impurity elements from penetrating into the substrate 10, the buffer layer 11 may be disposed on the substrate 10. The buffer layer 11 may have a single-layer structure or a multiple-layer structure including silicon nitride and/or silicon oxide.

The active layer 212 may be disposed on the buffer layer 11. The active layer 212 may be formed of a semiconductor including amorphous silicon or crystalline silicon, and may include a channel region 212c, and a source region 212a and a drain region 212b formed by doping portions around the channel region 212c with ion impurities.

A gate electrode 214 may be disposed on the active layer 212 to correspond to the channel region 212c of the active layer 212. A first insulating layer 13, which may be a gate insulating film, may be disposed between the gate electrode 214 and the active layer 212. The gate electrode 214 may have a single-layer structure or a multi-layer structure including at least one metal selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

A source electrode 218a and a drain electrode 218b may be disposed on the gate electrode 214 to be respectively connected to the source region 212a and the drain region 212b of the active layer 212. A second insulating layer 15, which may be an interlayer insulating film, may be disposed between the source electrode 218a and the drain electrode 218b and the active layer 212. The source electrode 218a and the drain electrode 218b may have a single-layer structure or a multi-layer structure including at least one metal selected from Al, Pt, Pd, Ag, Mg, Au, Ni, Nd, Ir, Cr, Li, Ca, Mo, Ti, W, and Cu.

A fourth insulating layer 19 may be disposed on the second insulating layer 15 to cover the source electrode 218a and the drain electrode 218b.

The first insulating layer 13 may be used as a gate insulating film. The second insulating layer 15 may be used as an interlayer insulating film in the TFT region TFT1. Each of the first insulating layer 13 and the second insulating layer 15 may be an inorganic insulating film. The inorganic insulating film may include $SiO_2$, $SiN_x$, SiON, $Al_2O_3$, $TiO_2$, $Ta_2O_5$, $HfO_2$, $ZrO_2$, barium strontium titanate (BST), lead zirconium titanate (PZT), or the like.

The first insulating layer 13, which may be used as a gate insulating film, is not used as a dielectric film of the capacitor, as will be explained below. Accordingly, the first insulating layer 13 may be designed appropriately according to characteristics of a gate insulating film of the TFT without considering dielectric constant-related characteristics of the capacitor. For example, if silicon nitride ($SiN_x$), which is often used as a dielectric film of a capacitor in order to increase an electrostatic capacitance, were to be also used as a gate insulating film of the TFT, leakage current may occur in the TFT. However, according to the present embodiment, a dielectric film of the capacitor and a gate insulating film of the TFT may be separately formed, as shown in FIG. 1. The dielectric film and the gate insulating film may be selected in consideration of only the characteristics of the capacitor and the TFT, respectively.

In the pixel region PXL1, a pixel electrode 117 formed of the same material as an upper electrode 317 of the capacitor, which will be explained below, may be disposed on the substrate 10, the buffer layer 11, the first insulating layer 13, and the second insulating layer 15.

A third insulating layer 116 may be disposed between the pixel electrode 117 and the second insulating layer 15. The buffer layer 11, the first insulating layer 13, the second insulating layer 15, and the third insulating layer 116 may be sequentially disposed, from the substrate 10 toward the pixel electrode 117, between the pixel electrode 117 and the substrate 10.

The insulating layers disposed between the substrate 10 and the pixel electrode 117, that is, the buffer layer 11, the first insulating layer 13, the second insulating layer 15, and the fourth insulating layer 19, may be formed to have different refractive indices. Insulating layers having different refractive indices may be alternately disposed to function as a distributed Bragg reflector (DBR). Accordingly, the efficient use of light emitted by a light-emitting layer 119 may be improved.

Although the buffer layer 11, the first insulating layer 13, the second insulating layer 15, and the third insulating layer 116 may be formed as individual single layers, as shown in FIG. 1, it is also possible for the buffer layer 11, the first insulating layer 13, the second insulating layer 15, and the third insulating layer 116 to have multi-layer structures.

The pixel electrode 117 may be directly disposed on the third insulating layer 116. The third insulating layer 116 and the pixel electrode 117 may be patterned by using the same mask in the same mask process. Accordingly, the third insulating layer 116 and the pixel electrode 117 may share the same etched lateral surface. For example, lateral surfaces of the third insulating layer 116 may align with lateral surfaces of the pixel electrode 117.

The pixel electrode 117 may be formed of a transparent conductive material so that light may be emitted toward the pixel electrode 117. The transparent conductive material may include at least one of indium tin oxide (ITO), indium zinc oxide (IZO), zinc oxide (ZnO), indium oxide ($In_2O_3$), indium gallium oxide (IGO), and aluminum zinc oxide (AZO).

An organic light-emitting layer 120 may be formed on the pixel electrode 117, and light emitted by the organic light-emitting layer 120 may be emitted through the pixel electrode 117 formed of a transparent conductive material toward the substrate 10.

The fourth insulating layer 19 may be formed around the pixel electrode 117. An opening C3 through which the pixel electrode 117 is exposed may be formed in the fourth insulating layer 19. The organic light-emitting layer 120 may be disposed in the opening C3.

The organic light-emitting layer 120 may be formed of a low molecular weight organic material or a high molecular weight organic material. If the organic light-emitting layer 120 is formed of a low molecular weight organic material, a hole transport layer (HTL), a hole injection layer (HIL), an electron transport layer (ETL), an electron injection layer (EIL), and so on, may be stacked around the organic light-emitting layer 120. Other various layers may also be stacked. Examples of the low molecular weight organic material may include copper phthalocyanine (CuPc), N,N'-di(naphthalene-1-yl)-N,N'-diphenyl-benzidine (NPB), and tris-8-hydroxyquinoline aluminum (Alq3). If the organic light-emitting layer 120 is formed of a high molecular weight organic material, an HTL may be provided in addition to the organic light-emitting layer 120. The HTL may be formed of poly-(3,4)-ethylene-dihydroxy thiophene (PEDOT), polyaniline (APNI), or the like. Examples of the high molecular weight organic material may include a polyphenylenevinylene (PPV)-based high molecular weight organic material and a polyfluorene-based high molecular weight organic material. Also, an inorganic material may be further disposed between the organic light-emitting layer 120, the pixel electrode 117, and a counter electrode 121.

The counter electrode 121 may be disposed as a common electrode on the organic light-emitting layer 120. In the organic light-emitting display device 1 of FIG. 1, the pixel electrode 117 may operate as an anode and the counter electrode 121 operates as a cathode. It is also possible for the pixel electrode 117 to operate as a cathode and the counter electrode 121 to operate as an anode.

The counter electrode 121 may be a reflective electrode including a reflective material. The counter electrode 121 may include at least one of Al, Mg, Li, Ca, LiF/Ca, and LiF/Al. If the counter electrode 121 is a reflective electrode, light emitted by the organic light-emitting layer 120 may be reflected by the counter electrode 121 and may be transmitted through the pixel electrode 117 formed of a transparent conductive material toward the substrate 10.

The fourth insulating layer 19 covering the portions around the pixel electrode 117 may function as a pixel defining film between the pixel electrode 117 and the counter electrode 121.

The fourth insulating layer 19 may be an organic insulating film. The fourth insulating layer 19 may include a commercial polymer such as polymethyl methacrylate (PMMA) or polystyrene (PS), a polymer derivative having a phenol group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like.

The fourth insulating layer 19 may cover the source electrode 218a and the drain electrode 218b of the TFT. One of the source electrode 218a and the drain electrode 218b may be electrically connected to the pixel electrode 117. Although the source electrode 128a is shown as being connected to the pixel electrode 117 in FIG. 1, it is also possible for the pixel electrode 117 to be electrically connected to the drain electrode 218b.

A portion of one of the source electrode 218a and the drain electrode 218b connected to the pixel electrode 117 may be disposed over the pixel electrode 117. As described below, the source electrode 218a and the drain electrode 218b are patterned after the pixel electrode 117 has been patterned. Accordingly, the source electrode 218a and the drain electrode 218b may be formed of a material having an etching rate different from that of the pixel electrode 117.

In the capacitor region CAP1, a lower electrode 314 of the capacitor, which may be formed of the same material as the gate electrode 214 of the TFT, the upper electrode 317 of the capacitor, which may be formed of the same material as the pixel electrode 117, and a third insulating layer 316 directly disposed between the lower electrode 314 and the upper electrode 317 may be disposed on the substrate 10 and the buffer layer 11.

The second insulating layer 15 may be disposed between the gate electrode 214 of the TFT and the source electrode 218a and the drain electrode 218b. The second insulating layer 15 is not disposed between the upper electrode 317 and the lower electrode 314 of the capacitor. Accordingly, the second insulating layer 15 does not mainly function as a dielectric film of the capacitor. For example, as shown in FIG. 1, the second insulating layer 15 may slightly overlap with an outer portion of the lower electrode 314. As described below, the overlapped outer portion may be left when an opening C2 (see FIG. 4B), through which the lower electrode 314 is exposed, is formed by patterning the second insulating layer 15.

If the lower electrode 314 of the capacitor were to be entirely exposed when the second insulating layer 15 is patterned, a leakage current may occur between the lower electrode 314 and the upper electrode 317 formed on the third insulating layer 316. Accordingly, the second insulating layer 15 may partially cover the outer portion of the lower electrode 314 without entirely exposing the lower electrode 314. A leakage current may be prevented from occurring between the upper electrode 317 and the lower electrode 314.

The second insulating layer 15, which may function as an interlayer insulating film of the TFT, may be designed to have a thickness equal to or greater than a predetermined thickness in consideration of characteristics of the TFT. Since an electrostatic capacitance of a capacitor typically decreases as a thickness of a dielectric film increases, if the dielectric film were to have the same thickness as that of the interlayer insulating film, the electrostatic capacitance may decrease.

The second insulating layer 15 shown in FIG. 1 is not used as a dielectric film of the capacitor. The third insulating layer 316, which may be used as a dielectric film, may be thinner than the second insulating layer 15. Accordingly, an electrostatic capacitance may be prevented from being reduced. An appropriate electrostatic capacitance may be maintained when a thickness of the third insulating layer 316 is equal to or greater than about 500 Å and equal to or less than about 2000 Å.

The third insulating layer 316, which may be used as a dielectric film, may be formed of an insulating material having a high dielectric constant. As described above, the third insulating layer 316 may be separately formed from the first insulating layer 13 which is a gate insulating film. An electrostatic capacitance may increase when the third insulating layer 316 is formed of a material having a dielectric constant higher than that of the first insulating layer 13. An electrostatic capacitance may thereby increase without increasing an area of the capacitor. Accordingly, an area of the pixel electrode 117 may be relatively increased, and thus, an aperture ratio of the organic light-emitting display device 1 may be increased.

The third insulating layer 316 may be an inorganic insulating film. For example, the third insulating layer 316 may include at least one of $SiO_2$, $SiN_x$, SiON, $Al_2O_3$, $TiO_2$, $Ta_2O_5$, $HfO_2$, $ZrO_2$, BST, and PZT.

Also, as described below, the upper electrode 317 and the third insulating layer 316 may be patterned in the same mask process. The upper electrode 317 and the third insulating layer 316 may have the same etched surface. For example, lateral surfaces of the upper electrode 317 may line up with lateral surfaces of the third insulating layer 316.

The fourth insulating layer 19 may be disposed on the upper electrode 317. The fourth insulating layer 19 may be an organic insulating film. The fourth insulating layer 19 may include an organic insulating material having a low dielectric constant and may be disposed between the counter electrode 121 and the upper electrode 317. Accordingly, a parasitic capacitance, which may be formed between the counter electrode 121 and the upper electrode 317, may be reduced, and thus, signal interference due to the parasitic capacitance may be prevented.

The pad region PAD1 in which the pad electrode 418, which is a connection terminal of an external drive, may be disposed in an outer region of the organic light-emitting display device 1.

In FIG. 1, the pad electrode 418 may be formed of the same material as the source electrode 218a and the drain electrode 218b. Also, the pad electrode 418 may be disposed on the same layer as the source electrode 218a and the drain electrode 218b. The pad electrode 418 is directly disposed on the second insulating layer 15.

The pad electrode 418 is formed after the gate electrode 214, the pixel electrode 117, and the upper electrode 317 are formed. Accordingly, a material for forming the gate electrode 214, the pixel electrode 117, or the upper electrode 317 is not located over the pad electrode 418. The reliability of the pad electrode 418 may be prevented from being reduced in a process of locating a material for forming the gate electrode 214, the pixel electrode 117, or the upper electrode 317 on the pad electrode 418 or removing such material from the pad electrode 418.

Although not shown in FIG. 1, the organic light-emitting display device 1 may further include an encapsulation member (not shown) for encapsulating a display region including the pixel region PXL1, the capacitor region CAP1, and the TFT region TFT1. The encapsulation member may be formed as a substrate including a glass material, a metal film, or an encapsulation thin film by alternately disposing an organic insulating film and an inorganic insulating film.

A method of manufacturing the organic light-emitting display device 1 according to an embodiment will be explained with reference to FIGS. 2A through 7B.

Figure 2A:
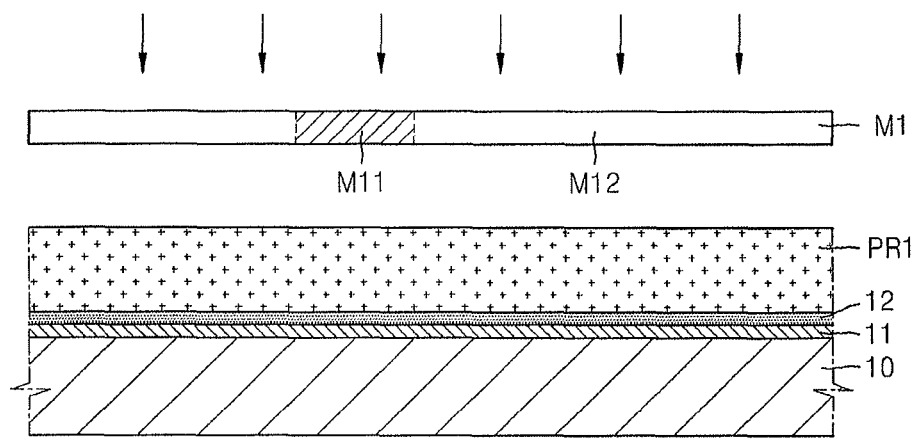
FIGS. 2A and 2B illustrate cross-sectional views depicting a first mask process of a method of manufacturing organic light-emitting display device.
Figure 2B:
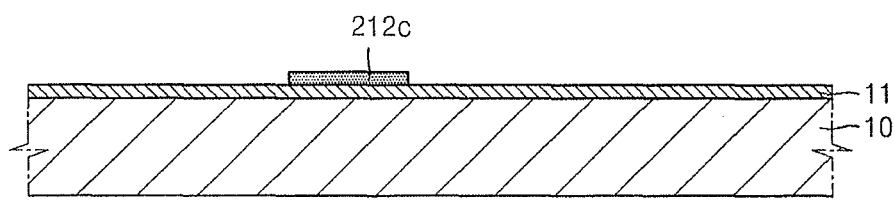

FIGS. 2A and 2B illustrate cross-sectional views depicting a first mask process of the method of manufacturing the organic light-emitting display device 1.

Referring to FIG. 2A, the buffer layer 11 and the semiconductor layer 12 may be sequentially formed on the substrate 10.

The buffer layer 11 and the semiconductor layer 12 may be deposited by using any of various deposition methods such as plasma enhanced chemical vapor deposition (PECVD), atmospheric pressure CVD (APCVD), and low pressure CVD (LPCVD).

The semiconductor layer 12 may be formed of amorphous silicon or crystalline silicon. The crystalline silicon may be formed by crystallizing the amorphous silicon. Examples of a method of crystallizing amorphous silicon may include rapid thermal annealing (RTA), solid phase crystallization (SPC), excimer laser annealing (ELA), metal induced crystallization (MIC), metal induced lateral crystallization (MILC), or sequential lateral solidification (SLS).

A first photoresist PR1 may be applied to the semiconductor layer 12, and the first mask process may be performed by using a first photomask M1 including a light-blocking portion M11 and a light-transmitting portion M12. Although not shown, after exposure is performed by using an exposure device (not shown), a series of steps such as developing, etching, and stripping or ashing may be performed.

FIG. 2B illustrates a cross-sectional view depicting a resultant structure of the first mask process.

Referring to FIG. 2B, a portion of the semiconductor layer 12 corresponding to the light-blocking portion M11 of the first photomask M1 may be patterned to form the channel region 212c of the active layer 212 of the TFT.

Figure 3A:
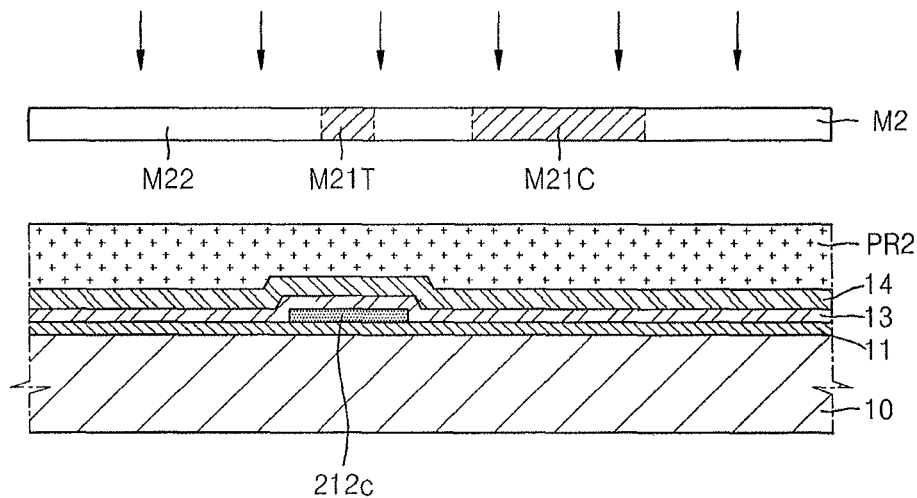
FIGS. 3A and 3B illustrate cross-sectional views depicting a second mask process of the method of manufacturing the organic light-emitting display device.
Figure 3B:
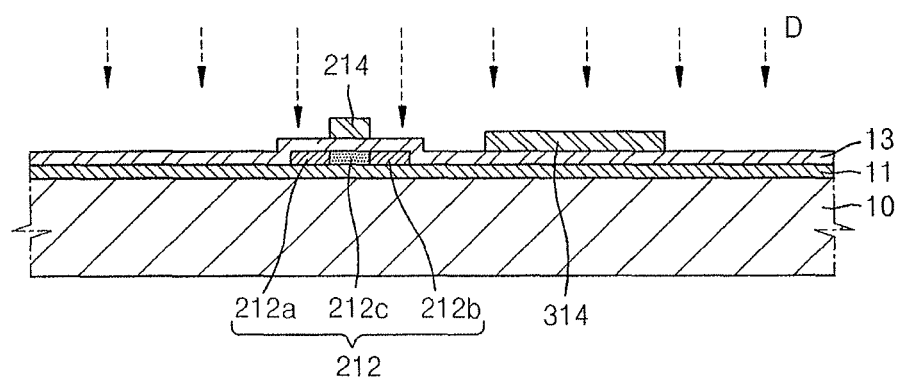

FIGS. 3A and 3B illustrate cross-sectional views depicting a second mask process of the method of manufacturing the organic light-emitting display device 1.

Referring to FIG. 3A, the first insulating layer 13 and the first conductive layer 14 may be sequentially formed on the resultant structure of the first mask process of FIG. 2B.

The first insulating layer 13 may be an inorganic insulating film formed of at least one of $SiO_2$, $SiN_x$, SiON, $Al_2O_3$, $TiO_2$, $Ta_2O_5$, $HfO_2$, $ZrO_2$, BST, and PZT. The first conductive layer 14 may have a single-layer structure or a multi-layer structure formed of at least one metal selected from Al, Pt, Pd, Ag, Mg, Au, Ni, Nd, Ir, Cr, Li, Ca, Mo, Ti, W, and Cu.

A second photoresist PR2 may be applied to the first conductive layer 14. The second mask process may be performed by using a second photomask M2 including light-blocking portions M21T and M21C and a light-transmitting portion M22.

FIG. 3B illustrates a cross-sectional view depicting a resultant structure of the second mask process.

Referring to FIG. 3B, a portion of the first conductive layer 14 corresponding to the light-blocking portion M21T of the second mask M2 may be patterned to form the gate electrode 214 of the TFT. A portion of the first conductive layer 14 corresponding to the light-blocking portion M21C may be patterned to form the lower electrode 314 of the capacitor.

While the portion of the first insulating layer 13 that is disposed between the gate electrode 214 and the active layer 212 of the TFT may function as a gate insulating film, the portion of the first insulating layer 13 that is disposed under the lower electrode 314 does not function as a dielectric film of the capacitor. Accordingly, a material of the first insulating layer 13 may be selected in consideration of only characteristics of the TFT without considering characteristics of the capacitor.

The resultant structure of the second mask process may be doped with ion impurities. The ion impurities may be B ion impurities or P ion impurities. The resultant structure may be doped by using the active layer 212 of the TFT as a target and providing a doping amount of $1 \times 10^{15}$ atoms/cm$^2$ or more.

The active layer 212 may include the source and drain regions 212a and 212b and the channel region 212c disposed between the source and drain regions 212a and 212b. The source and drain regions 212a and 212b may be doped with ion impurities by using the gate electrode 214 as a self-aligned mask.

Meanwhile, although not shown in FIGS. 3A and 3B, a wiring such as a scan line connected to the gate electrode 214 may also be formed by patterning the first conductive layer 14 in the second mask process.

Figure 4A:
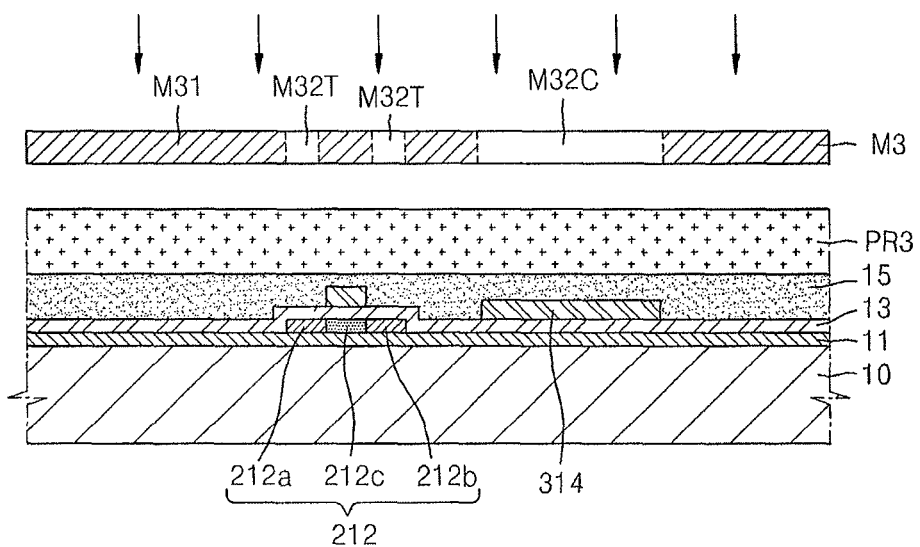
FIGS. 4A and 4B illustrate cross-sectional views depicting a third mask process of the method of manufacturing the organic light-emitting display device.
Figure 4B:
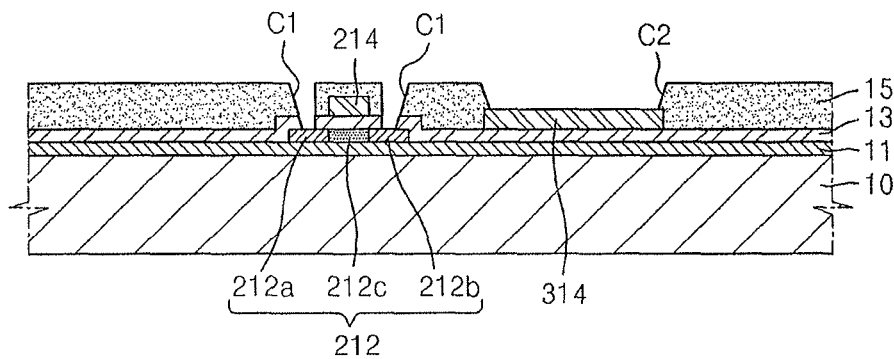

FIGS. 4A and 4B illustrate cross-sectional views depicting a third mask process of the method of manufacturing the organic light-emitting display device 1.

Referring to FIG. 4A, the second insulating layer 15 may be formed on the resultant structure of the second mask process of FIG. 3B.

The second insulating layer 15 may be an inorganic insulating film formed of at least one of $SiO_2$, $SiN_x$, SiON, $Al_2O_3$, $TiO_2$, $Ta_2O_5$, $HfO_2$, $ZrO_2$, BST, and PZT. For example, the first second insulating layer 15 may be formed of a material having a refractive index different from that of a material of the first insulating layer 13.

A third photoresist PR3 may be applied to the second insulating layer 15. The third mask process may be performed by using a third photomask M3 including a light-blocking portion M31 and light-transmitting portions M32T and M32C.

FIG. 4B illustrates a cross-sectional view depicting a resultant structure of the third mask process.

Referring to FIG. 4B, a portion of the second insulating layer 15 corresponding to the light-transmitting portion M32T of the third photomask M3 may be formed to include an opening C1 through which the source region 212a and the drain region 212b of the active layer 212 are partially exposed, and a portion of the second insulating layer 15 corresponding to the light-transmitting portion M32C may be patterned to form the opening C2 through which the lower electrode 314 of the capacitor is exposed.

Figure 5A:
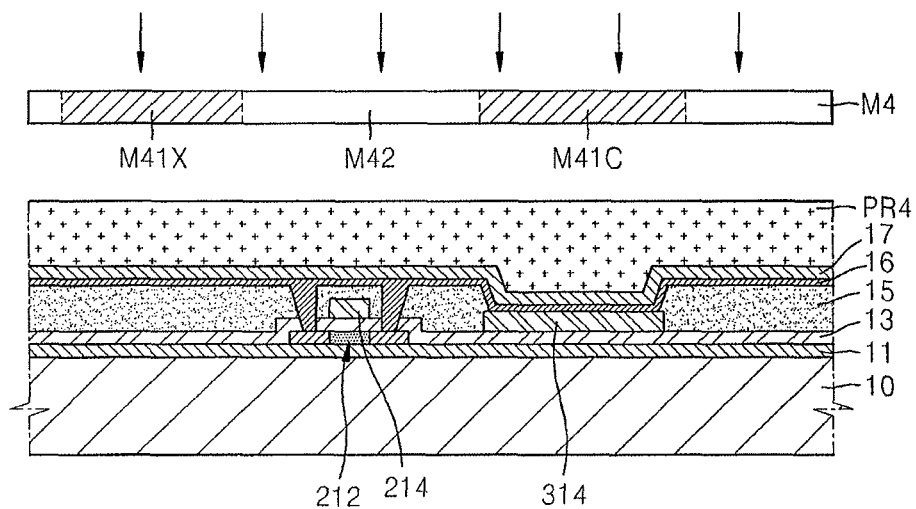
FIGS. 5A and 5B illustrate cross-sectional views depicting a fourth mask process of the method of manufacturing the organic light-emitting display device.
Figure 5B:
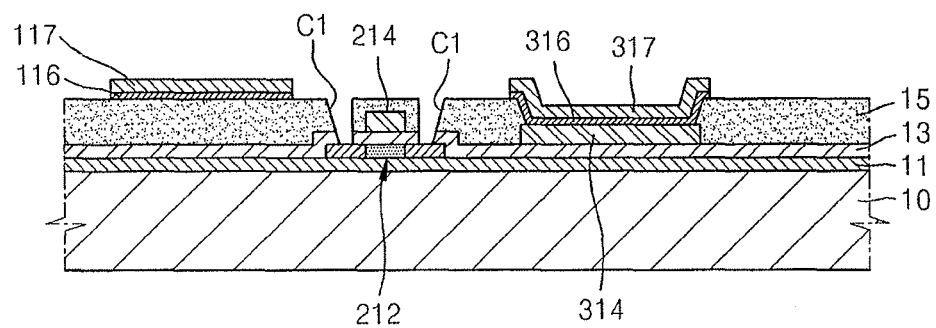

FIGS. 5A and 5B illustrate cross-sectional views depicting a fourth mask process of the method of manufacturing the organic light-emitting display device 1.

Referring to FIG. 5A, a third insulating layer 16 and a second conductive layer 17 may be sequentially formed on the resultant structure of the third mask process of FIG. 4B. The third insulating layer 16 and the second conductive layer 17 may be sequentially stacked on the upper electrode 314 of the capacitor and the second insulating layer 15.

The third insulating layer 16 may be an inorganic insulating film formed of a material selected from the group consisting of $SiO_2$, $SiN_x$, SiON, $Al_2O_3$, $TiO_2$, $Ta_2O_5$, $HfO_2$, $ZrO_2$, BST, and PZT. The third insulating layer 16 may be formed of a material having a refractive index different from refractive indices of the first insulating layer 13 and the second insulating layer 15.

The second conductive layer 17 may be formed of a transparent conductive oxide. For example, the second conductive layer 17 may be formed of a material selected from the group consisting of ITO, IZO, ZnO, $In_2O_3$, IGO, and AZO.

A fourth photoresist PR4 may be applied to the second conductive layer 17. The fourth mask process may be performed by using a fourth photomask M4 including light-blocking portions M41X and M41C and a light-transmitting portion M42.

FIG. 5B illustrates a cross-sectional view depicting a resultant structure of the fourth mask process.

Referring to FIG. 5B, portions of the third insulating layer 16 and the second conductive layer 17 corresponding to the light-blocking portion M41X of the fourth photomask M4 may be patterned to form the pixel electrode 117 and the third insulating layer 116 disposed under the pixel electrode 117. Portions of the third insulating layer 16 and the second conductive layer 17 corresponding to the light-blocking portion M41C may be patterned to form the dielectric film 316 and the upper electrode 317 of the capacitor.

Although the third insulating layer 16 and the second conductive layer 17 may be patterned in the same mask process, etching may be performed two times. An etching the third insulating layer 16 and an etching of the second conductive layer 17 may be separately performed.

The third insulating layer 16 and the second conductive layer 17 may be etched in the same mask process, etched surfaces of the third insulating layer 16 and the second conductive layer 17. Etched surfaces of the third insulating layer 116 and the pixel electrode 117 may be identical to each other and etched surfaces of the dielectric film 316 and the upper electrode 317 may also be identical to each other. The pixel electrode 117 and the upper electrode 317 may function as etch masks when the third insulating layer 116 disposed under the pixel electrode 117 and the dielectric film 316 are etched, and thus, etched surfaces thereof may be substantially identical to each other. For example, lateral surfaces of the pixel electrode 317 may align with lateral surfaces of the third insulating layer 116, and lateral surfaces of the dielectric film 316 may align with lateral surfaces of the upper electrode 317.

The third insulating layer 16 may be directly disposed between the upper electrode 317 and the lower electrode 314. Accordingly, the third insulating layer 16 may function as the dielectric film 316 of the capacitor. The third insulating layer 16 is not located in the TFT. Accordingly, the third insulating layer 16 does not function as a gate insulating film. A material or a thickness of the third insulating layer 16 may be selected in consideration of only the characteristics of the capacitor without considering the characteristics of the TFT. Accordingly, the degree of design freedom is increased.

Figure 6A:
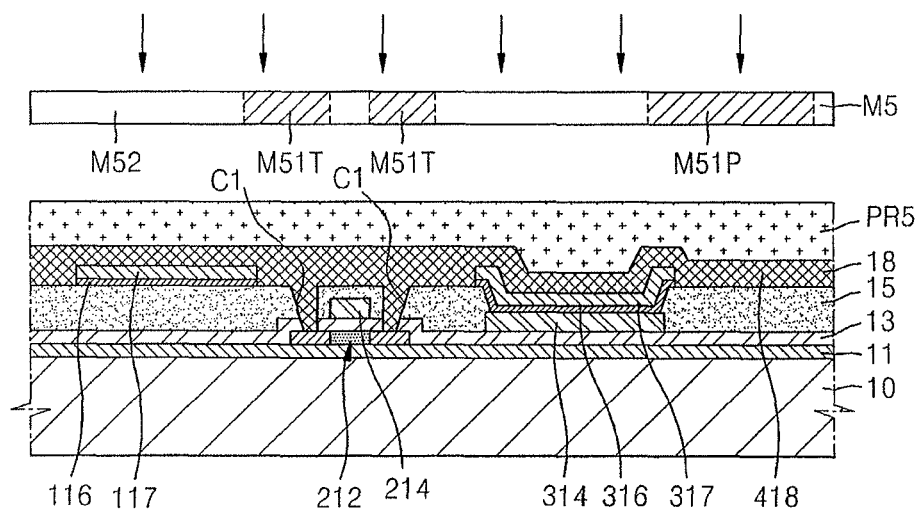
FIGS. 6A and 6B illustrate cross-sectional views depicting a fifth mask process of the method of manufacturing the organic light-emitting display device.
Figure 6B:
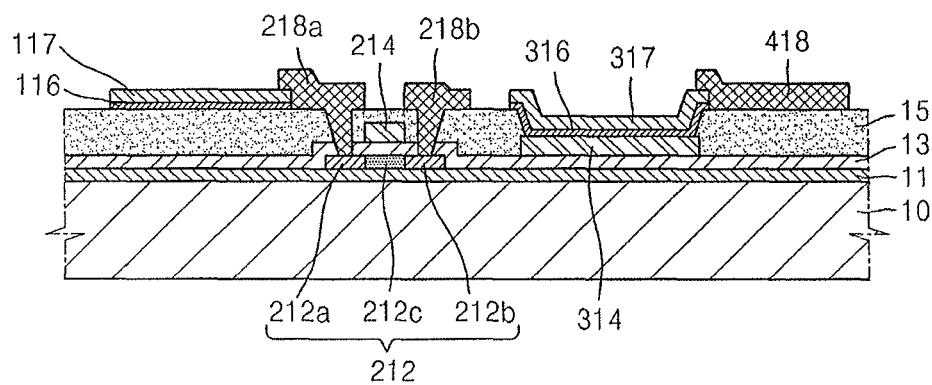

FIGS. 6A and 6B illustrate cross-sectional views depicting a fifth mask process of the method of manufacturing the organic light-emitting display device 1.

Referring to FIG. 6A, a third conductive layer 18 may be formed on the resultant structure of the fourth mask process of FIG. 5B. The third conductive layer 18 may be filled in the opening C1 through which the source region 212a and the drain region 212b are exposed.

The third conductive layer 18 may have a single-layer structure or a multi-layer structure and may be formed of at least one metal selected from Al, Pt, Pd, Ag, Mg, Au, Ni, Nd, Ir, Cr, Li, Ca, Mo, Ti, W, and Cu.

A fifth photoresist PR5 may be applied to the third conductive layer 18. The fifth mask process may be performed by using a fifth photomask M5 including light-blocking portions M51T and M51P and a light-transmitting portion M52.

FIG. 6B illustrates a cross-sectional view depicting a resultant structure of the fifth mask process.

Referring to FIG. 6B, portions of the third conductive layer 18 corresponding to the light-blocking portion M51T of the fifth photomask M5 may be patterned to form the source electrode 218a and the drain electrode 218b respectively connected to the source region 212a and the drain region 212b of the active layer 212 through the opening C1. A portion of the third conductive layer 18 corresponding to the light-blocking portion M51P may be patterned to form the pad electrode 418 of the pad region.

When the third conductive layer 18 is etched in order to form the source electrode 218a and the drain electrode 218b, the pixel electrode 117 and the upper electrode 317 may also be exposed to an etchant for etching the third conductive layer 18. Accordingly, the third conductive layer 18 may be formed of a material having an etching rate different from the etching rates of the pixel electrode 117 and the upper electrode 317.

One of the source electrode 218a and the drain electrode 218b may be electrically connected to the pixel electrode 117. The source electrode 218a and the drain electrode 218b may be patterned after the pixel electrode 117 is formed in FIGS. 6A and 6B. Accordingly, a portion of one of the source electrode 218a or the drain electrode 218b connected to the pixel electrode 117 may be formed over the pixel electrode 117.

Although not shown, a wiring such as a data line connected to the source electrode 218a and/or the drain electrode 218b may be formed by patterning the third conductive layer 18 in the fifth mask process.

Figure 7A:
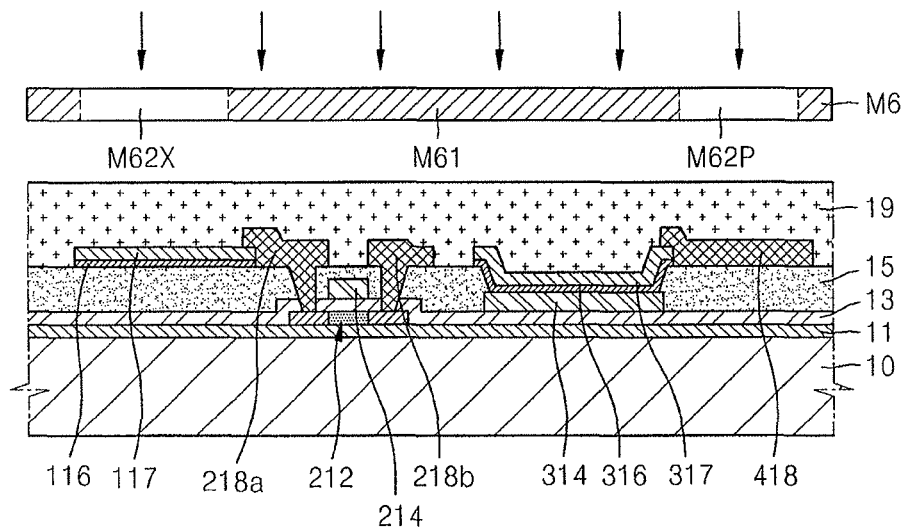
FIGS. 7A and 7B illustrate cross-sectional views depicting a sixth mask process of the method of manufacturing the organic light-emitting display device.
Figure 7B:
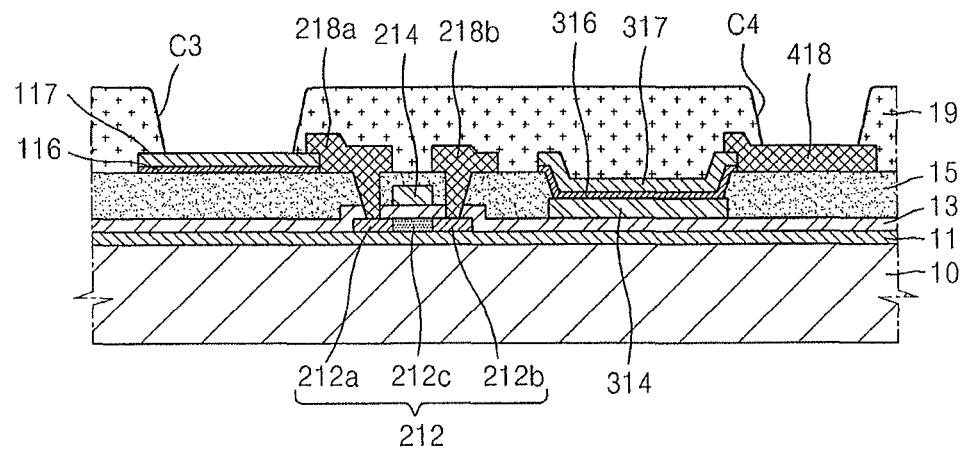

FIGS. 7A and 7B illustrate cross-sectional views depicting a sixth mask process of the method of manufacturing the organic light-emitting display device 1.

Referring to FIG. 7A, the fourth insulating layer 19 may be applied to the resultant structure of the fifth mask process of FIG. 6B. The fourth insulating layer 19 may be an organic insulating film. In particular, if the fourth insulating layer 19 is a photosensitive organic insulating film, use of an additional photoresist may not be necessary.

The sixth mask process may be performed by using a sixth photomask M6 including a light-blocking portion M61 and light-transmitting portions M62X and M62P.

FIG. 7B illustrates a cross-sectional view depicting a resultant structure of the sixth mask process.

Referring to FIG. 7B, a portion of the fourth insulating layer 19 corresponding to the light-transmitting portion M62X may be removed to form the opening C3 through which the pixel electrode 117 is partially exposed. A portion of the fourth insulating layer 19 corresponding to the light-transmitting portion M62P may be removed to form the opening C4 through which the pad electrode 418 is partially exposed.

The opening C3 through which the pixel electrode 117 is exposed not only may define a light-emitting region but also may increase an interval between the counter electrode 121 (see FIG. 1) and an edge of the pixel electrode 117. Accordingly, an electric field may be prevented from concentrating on the edge of the pixel electrode 117 and a short circuit may be prevented from occurring between the pixel electrode 117 and the counter electrode 120.

Although not shown, the organic light-emitting device 1 of FIG. 1 may be formed by forming the organic light-emitting layer 120 on the pixel electrode 117 and forming the counter electrode 121 (see FIG. 1), which may be a common electrode, on the organic light-emitting layer 120 after the sixth mask process. Also, an encapsulation member (not shown) may be further formed on the counter electrode 121 (see FIG. 1).

An organic light-emitting display device 2 according to another embodiment will be explained with reference to FIG. 8 by focusing on a difference from the organic light-emitting display device 1 of FIG. 1.

Figure 8:
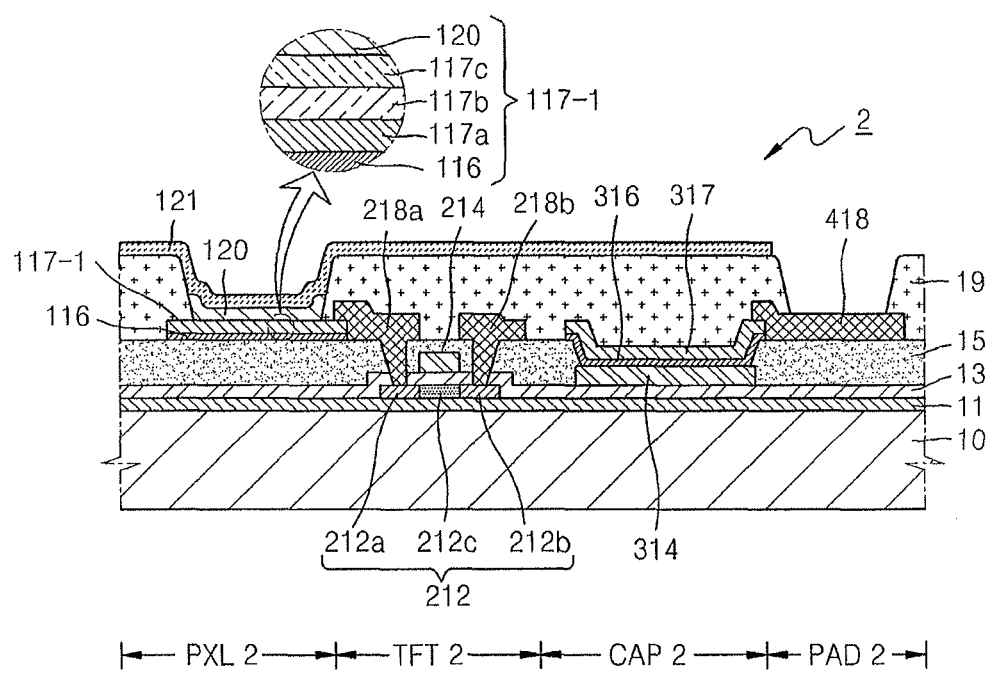
FIG. 8 illustrates a cross-sectional view depicting an organic light-emitting display device according to another embodiment.

FIG. 8 illustrates a cross-sectional view depicting the organic light-emitting display device 2 according to another embodiment.

Referring to FIG. 8, the substrate 10 of the organic light-emitting display device 2 includes a pixel region PXL2 in which at least one organic light-emitting layer 119 may be disposed, a TFT region TFT2 in which at least one TFT may be disposed, a capacitor region CAP2 in which at least one capacitor may be disposed, and a pad region PAD2 in which at least one pad electrode 418 may be disposed. The TFT region TFT2 and the pad region PAD2 may be the same as the TFT region TFT1 and the pad region PAD1 of the organic light-emitting display device 1.

In the pixel region PXL2, a pixel electrode 117-1, formed of the same material as the upper electrode 317 of the capacitor, may be disposed on the substrate 10, the buffer layer 11, the first insulating layer 13, the second insulating layer 15, and the third insulating layer 116.

If the organic light-emitting display device 2 is a bottom-emission organic light-emitting display device, the pixel electrode 117-1 may be a transparent electrode and the counter electrode 121 may be a reflective electrode.

The organic light-emitting layer 119 may be formed on the pixel electrode 117-1, and light emitted by the organic light-emitting layer 119 may be emitted through the pixel electrode 117-1 formed of a transparent conductive material toward the substrate 10.

The pixel electrode 117-1 of the organic light-emitting display device 2 may have a multi-layer structure including a transparent conductive layer 117a and a semi-transmissive metal layer 117b disposed on the transparent conductive layer 117a.

The counter electrode 121 may function as a reflective mirror and the semi-transmissive metal layer 117b may function as a semi-transmissive mirror. Light emitted by the organic light-emitting layer 119 may resonate between the organic light-emitting layer 119 and the semi-transmissive metal layer 117b.

Accordingly, light use efficiency of the organic light-emitting display device 2 may be further improved by a resonance effect due to a mirror effect as well as a resonance effect due to a DBR effect of the first through third insulating layers 13, 15, and 116, which may be disposed under the pixel electrode 117-1.

The semi-transmissive metal layer 117b may be formed of at least one material selected from Ag, an Ag alloy, Al, and an Al alloy. In order to act as a resonant mirror with respect to the counter electrode 121, which may be a reflective electrode, the semi-transmissive metal layer 117b may have a thickness equal to or less than about 300 Å.

In particular, if the semi-transmissive metal layer 117b includes silver (Ag), since the source electrode 218a and the drain electrode 218b may be formed after the semi-transmissive metal layer 117b is formed, the semi-transmissive metal layer 117b including Ag may be damaged when the source electrode 218a and the drain electrode 218b are etched. Accordingly, a protective layer 117c for protecting the Ag may be further provided on the semi-transmissive metal layer 117b. The protective layer 117c may be formed of a transparent conductive oxide including ITO or the like.

The pixel electrode 117-1 including the semi-transmissive metal layer 117b may be patterned in the fourth mask process. The pixel electrode 117-1 may be patterned alone when another conductive layer does not exist over the pixel electrode 117-1.

If another conductive layer (not shown) is further formed over the pixel electrode 117-1 and the conductive layer and the pixel electrode 117-1 are simultaneously patterned to have the same pattern, it may not be easy to etch the pixel electrode 117-1. In particular, if the semi-transmissive metal layer 117b includes Ag, since the semi-transmissive metal layer 117b may be easily damaged, it may be difficult to form a resonant structure using a mirror effect. However, as shown in FIG. 8, the pixel electrode 117-1 may be patterned alone to function as a semi-transmissive mirror having a resonant structure. Accordingly, it may be easy to form a resonant mirror.

The pixel electrode 117-1 and the upper electrode 317 of the capacitor of the organic light-emitting display device 2 may be formed of the same material. Although not shown, the upper electrode 317 may include a transparent conductive layer, a semi-transmissive metal layer, and a protective layer which are sequentially disposed from the bottom, like the pixel electrode 117-1.

By way of summation and review, in the formation of a flat panel display device a TFT, a capacitor, and a wiring are finely patterned on a substrate. In order to form such a fine pattern on the substrate, photolithography is often used to transfer a pattern by using a mask.

Photolithography involves uniformly applying a photoresist to a substrate on which a pattern is to be formed, exposing the photoresist by using exposure equipment such as a stepper, developing the photoresist if the photoresist is a positive photoresist, etching the pattern formed on the substrate by using a remaining part of the photoresist, and removing an unnecessary remaining part of the photoresist after the pattern is formed.

A mask including a desired pattern may be prepared in advance when photolithography is used, and the cost for preparing the mask increases the cost for manufacturing a flat panel display device. Also, when complicated steps are performed, the manufacturing process of the flat display device may become complex and the manufacturing time may increase, and thus, the general manufacturing costs of the flat display device may increase.

Embodiments disclosed herein may provide a thin film transistor (TFT) array substrate and an organic light-emitting display device including the TFT array substrate that may be manufactured by a method that uses a simple manufacturing process. The light emitting display device may have excellent signal transmission characteristics.

In more detail, a TFT array substrate, an organic light-emitting display device including the same, and a method of manufacturing the organic light-emitting display device including the TFT array substrate according to the present embodiments provide the following effects.

A dielectric film of a capacitor and a gate insulating film of a TFT may be formed as separate insulating layers. Accordingly, the insulating layers may be designed appropriately according to characteristics of the capacitor and characteristics of the TFT, respectively.

A thickness of the dielectric film of the capacitor may be easily controlled. Accordingly, an aperture ratio may be increased.

A resonant mirror may be patterned from only a pixel electrode, without a conductive layer stacked on the pixel electrode that is used as a semi-transmissive mirror of a resonant structure. Accordingly, a resonant mirror may be easily provided.

A pad electrode may be formed in a post-process. Accordingly, the reliability of the pad electrode may be prevented from being lowered.

The TFT array substrate and the organic light-emitting display device may be manufactured by performing only 6 mask processes.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A method of manufacturing a TFT array substrate, the method comprising:

forming a semiconductor layer on a substrate and forming an active layer of a TFT by patterning the semiconductor layer using a first mask process;

forming a first insulating layer, stacking a first conductive layer on the first insulating layer, and forming a gate electrode of the TFT and a lower electrode of a capacitor by patterning the first conductive layer using a second mask process;

forming a second insulating layer, and forming an opening in the second insulating layer using a third mask process to expose a source region and a drain region of the active layer and the lower electrode of the capacitor;

sequentially forming a third insulating layer and a second conductive layer on a resultant structure of the third mask process, and forming a pixel electrode, an upper electrode of the capacitor, and a dielectric film that is disposed on the lower electrode of the capacitor by simultaneously or sequentially patterning the third insulating layer and the second conductive layer using a fourth mask process;

forming a third conductive layer on a resultant structure of the fourth mask process, and forming a source electrode and a drain electrode by patterning the third conductive layer using a fifth mask process; and forming a fourth insulating layer and removing a portion of the fourth insulating layer to expose the pixel electrode using a sixth mask process.

2. The method as claimed in claim 1, wherein the method further includes doping the source region and the drain region with ion impurities after forming the gate electrode using the second mask process.

3. The method as claimed in claim 1, wherein the fourth mask process includes a first etching process to etch the third insulating layer, and a second etching process to etch the second conductive layer.

4. The method as claimed in claim 1, wherein the third conductive layer includes a material having an etching rate different from an etching rate of a material of the second conductive layer.

5. The method as claimed in claim 1, further including forming a pad electrode including the same material as the source electrode and the drain electrode using the fifth mask process.

6. The method as claimed in claim 1, wherein the second conductive layer is formed by sequentially stacking a transparent conductive layer and a semi-transmissive conductive layer.

7. The method as claimed in claim 6, further including forming a protective layer on the semi-transmissive conductive layer.

8. The method as claimed in claim 1, wherein the third insulating layer is formed to have a thickness less than a thickness of the second insulating layer.

9. The method as claimed in claim 1, wherein the third insulating layer is formed of a material having a dielectric constant higher than a dielectric constant of the first insulating layer.

* * * * *